US012721197B2

(12) United States Patent
Morimoto et al.

(10) Patent No.: US 12,721,197 B2
(45) Date of Patent: Aug. 25, 2026

(54) INSULATING CIRCUIT BOARD AND SEMICONDUCTOR DEVICE USING SAME

(71) Applicants: KABUSHIKI KAISHA TOSHIBA, Tokyo (JP); TOSHIBA MATERIALS CO., LTD., Yokohama (JP)

(72) Inventors: Kazumitsu Morimoto, Yokohama Kanagawa (JP); Hideaki Hirabayashi, Yokohama Kanagawa (JP)

(73) Assignee: Niterra Materials Co., Ltd., Yokohama (JP)

( * ) Notice: Subject to any disclaimer, the term of this patent is extended or adjusted under 35 U.S.C. 154(b) by 484 days.

(21) Appl. No.: 18/339,431

(22) Filed: Jun. 22, 2023

(65) Prior Publication Data

US 2023/0335483 A1 Oct. 19, 2023

Related U.S. Application Data

(63) Continuation of application No. PCT/JP2021/047664, filed on Dec. 22, 2021.

(30) Foreign Application Priority Data

Dec. 24, 2020 (JP) ................................ 2020-214953

(51) Int. Cl.
*H10W 70/66* (2026.01)
*H10W 70/692* (2026.01)
(Continued)

(52) U.S. Cl.
CPC ........ *H10W 70/664* (2026.01); *H10W 70/692* (2026.01); *H10W 72/352* (2026.01); *H10W 90/734* (2026.01)

(58) Field of Classification Search
CPC ... H01L 23/49877; H01L 24/29; H01L 24/32; H10W 70/664
See application file for complete search history.

(56) References Cited

U.S. PATENT DOCUMENTS 12,167,534 B2 * 12/2024 Kato .................... H05K 1/0271
2012/0114966 A1 * 5/2012 Tuan .................. H01L 23/3735 428/317.5
(Continued)

FOREIGN PATENT DOCUMENTS

EP 3683335 7/2020
JP 2013-055264 3/2013
(Continued)

OTHER PUBLICATIONS

Office Action issued Sep. 12, 2025 in corresponding Japanese Patent Application No. 2025-019055.
(Continued)

*Primary Examiner* — Eugene Lee
(74) *Attorney, Agent, or Firm* — Harness, Dickey & Pierce, PLC

(57) ABSTRACT

According to the embodiment, in an insulating circuit board in which a conductor part is bonded to at least one surface of an insulating substrate, in XPS analysis of the carbon amount at the surface of the conductor part, the average value of the carbon amounts at any three locations is within the range of not less than 0 at % and not more than 70 at %. In XPS analysis of the oxygen amount of the conductor part surface, it is favorable for the average value of any three locations to be within the range of not less than 3 at % and not more than 50 at %.

18 Claims, 1 Drawing Sheet

(51) Int. Cl.
*H10W 72/30* (2026.01)
*H10W 90/00* (2026.01)

(56) References Cited

U.S. PATENT DOCUMENTS

| | | | | |
|---|---|---|---|---|
| 2012/0168209 | A1* | 7/2012 | Kato | H05K 3/38 174/255 |
| 2014/0291699 | A1 | 10/2014 | Yano et al. | |
| 2016/0221305 | A1* | 8/2016 | Terasaki | B32B 7/12 |
| 2016/0358840 | A1* | 12/2016 | Aono | B23K 35/3006 |
| 2017/0040272 | A1* | 2/2017 | Chong | H01L 24/05 |
| 2018/0005918 | A1 | 1/2018 | Naba et al. | |
| 2018/0255645 | A1 | 9/2018 | Ideno et al. | |
| 2019/0081020 | A1* | 3/2019 | Sano | H01L 24/29 |
| 2019/0327831 | A1 | 10/2019 | Kato et al. | |
| 2020/0006213 | A1* | 1/2020 | Terasaki | C04B 37/023 |
| 2020/0170118 | A1 | 5/2020 | Kato et al. | |
| 2020/0185320 | A1 | 6/2020 | Aono et al. | |
| 2023/0335483 | A1 | 10/2023 | Morimoto et al. | |

FOREIGN PATENT DOCUMENTS

| | | | |
|---|---|---|---|
| JP | 2017-130686 | | 7/2017 |
| JP | 2018-145047 | | 9/2018 |
| JP | 2020-161524 | | 10/2020 |
| JP | 7642678 | B2 | 3/2025 |
| WO | WO-2013/094213 | A1 | 6/2013 |
| WO | WO-2017/056360 | A1 | 4/2017 |
| WO | WO-2018/180965 | | 10/2018 |
| WO | WO-2018/225809 | | 12/2018 |
| WO | WO-2019/054291 | | 3/2019 |
| WO | WO-2019/054294 | | 3/2019 |

OTHER PUBLICATIONS

Extended European Search Report issued Nov. 4, 2024 in corresponding European Patent Application No. 21910890.9.

* cited by examiner

INSULATING CIRCUIT BOARD AND SEMICONDUCTOR DEVICE USING SAME

CROSS-REFERENCE TO RELATED APPLICATIONS

This is a continuation application of International Patent Application PCT/JP2021/047664, filed on Dec. 22, 2021; and also claims priority to Japanese Patent Application No. 2020-214953, filed on Dec. 24, 2020; the entire contents of which are incorporated herein by reference.

FIELD

Embodiments described below generally relate to an insulating circuit board and a semiconductor device using an insulating circuit board.

BACKGROUND

A ceramic copper circuit board in which a ceramic substrate and a copper plate are bonded is used as a circuit board to which a semiconductor element or the like is mounted. A ceramic copper circuit board described in WO 2017/056360 (Patent Literature 1) includes an improved bonded body in which a ceramic substrate and a copper plate are bonded via a bonding layer. In Patent Literature 1, a jutting portion of the bonding layer jutting from the copper plate end portion is provided. The TCT characteristics are improved by controlling the size of such a bonding layer jutting portion. A semiconductor element is mounted to the ceramic copper circuit board to form a semiconductor device. Also, a leadframe is bonded to the ceramic copper circuit board, and/or wire bonding is performed. Lead-free solder is used to mount semiconductor elements, etc. To improve the adhesion with the solder layer, a plating film is made on the copper plate surface. The plating film includes a Ni plating film, a Au plating film, etc. Also, junction temperatures are expected to increase as the performance of semiconductor elements increases. Accordingly, bonding that uses Ag nanoparticles is being investigated for mounting semiconductor elements. To perform bonding using Ag nanoparticles, the formation of a Ag plating film on the copper plate surface is being investigated. For example, in WO 2018/225809 (Patent Literature 2), the surface roughness of a Ag plating film is controlled. In Patent Literature 2, the adhesion of the Ag plating film is improved. For example, WO 2019/054294 (Patent Literature 3) discusses a method in which a chemical polishing process and an etching process are combined. A chemical liquid such as aqueous hydrogen peroxide, hydrochloric acid, sulfuric acid, or the like is used in the chemical polishing process of Patent Literature 2. Furthermore, ammonium peroxodisulfate and the like are described in WO 2019/054291 (Patent Literature 4) as chemical liquids used in active metal brazing material etching that uses silver, copper, and titanium.

DRAWINGS

DETAILED DESCRIPTION

An insulating circuit board according to an embodiment includes an insulating substrate and a conductor part bonded to at least one surface of the insulating substrate, wherein in XPS analysis of the carbon amount at the surface of the conductor part, the average value of the carbon amounts at any three locations is within the range of not less than 0 at % and not more than 70 at %.

Figure 1:
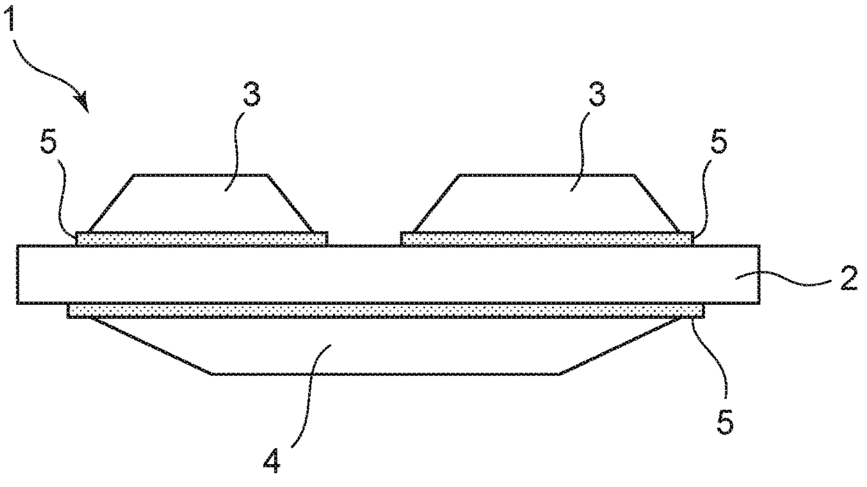
FIG. 1 is a schematic view showing an example of an insulating circuit board according to an embodiment.

FIG. 1 is a schematic view showing an example of the insulating circuit board according to the embodiment. In FIG. 1, 1 is an insulating circuit board, 2 is an insulating substrate, 3 is a conductor part (a front conductor part), 4 is a conductor part (a back conductor part), and 5 is a bonding layer. In the insulating circuit board 1 illustrated in FIG. 1, the conductor part 3 and the conductor part 4 are located respectively at two surfaces of the insulating substrate 2 with the bonding layer 5 interposed. In the structure illustrated in FIG. 1, the conductor part 3 is provided with a circuit configuration; and the conductor part 4 is used as a heat dissipation plate. For convenience, the conductor part 3 is called the front conductor part; and the conductor part 4 is called the back conductor part. Also, two front conductor parts 3 are provided. The insulating circuit board according to the embodiment is not limited to such a configuration. One, three, or more front conductor parts may be provided. The back conductor part 4 may be provided with a circuit configuration. Also, only the front conductor part 3 may be provided without providing the back conductor part 4.

Figure 2:
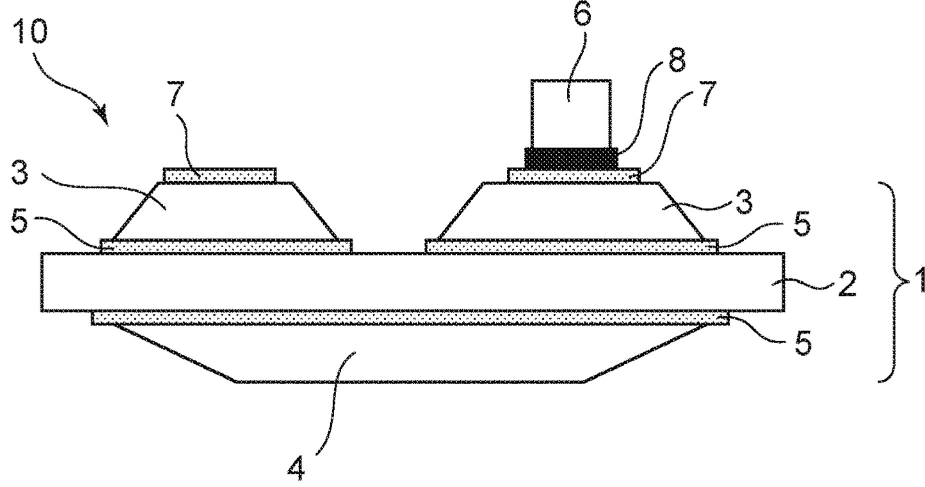
FIG. 2 is a schematic view showing an example of a semiconductor device according to the embodiment.

FIG. 2 is a schematic view showing an example of a semiconductor device according to the embodiment. In the semiconductor device illustrated in FIG. 2, plating films are provided on the surfaces of the conductor parts among the front conductor parts and the back conductor parts that are used to bond with the semiconductor element.

Figure 3:
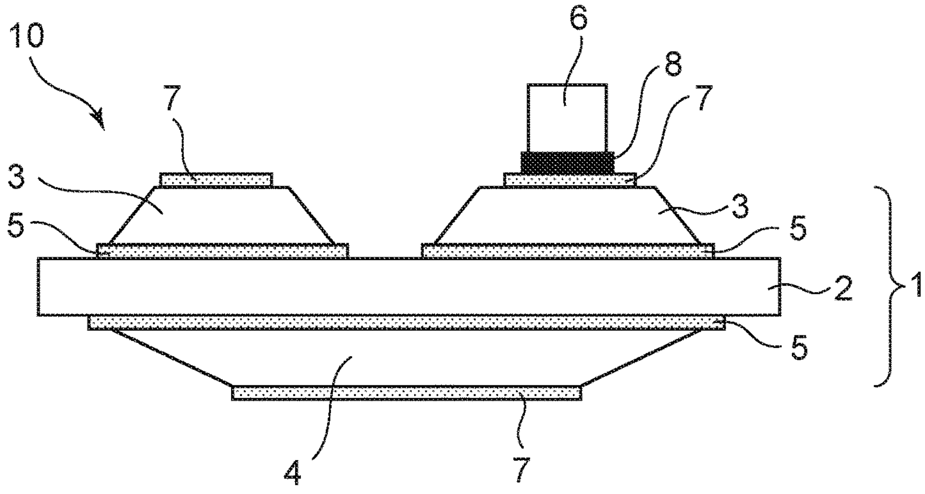
FIG. 3 is a schematic view showing another example of the semiconductor device according to the embodiment.

FIG. 3 is a schematic view showing another example of the semiconductor device according to the embodiment. FIG. 3 shows a structure in which plating films are provided at respectively two surfaces of the front conductor part and the back conductor part. The semiconductor device according to the embodiment is not limited to such a configuration. Plating films may be provided respectively at the front conductor parts; and semiconductor elements may be mounted respectively to the plating films. Semiconductor elements may be mounted to only a portion of the multiple plating films. Plating films may be provided at only a portion of the multiple front conductor parts; and semiconductor elements may be mounted to the plating films. The plating film is provided at a portion or the entire surface of the front conductor part. The plating film may be provided not only at the front surface of the front conductor part but also at a portion or the entire side surface. The plating film also may be provided at the back conductor part as necessary. The configuration of the plating film provided at the front conductor part may be the same as or different from the configuration of the plating film provided at the back conductor part. For example, the area of the plating film provided at the front conductor part may be the same as or different from the area of the plating film provided at the back conductor part. A plating film also may be provided at the side surface of one of the front conductor part or the back conductor part; and a plating film may not be provided at the side surface of the other. The components of the plating film provided at the front conductor part may be the same as or different from the components of the plating film provided at the back conductor part. Also, a plating film may be provided on the insulating circuit board shown in FIG. 1.

It is favorable for the insulating substrate to be a resin substrate or a ceramic substrate.

A resin substrate is less expensive than a ceramic substrate and is favorable when cost is a major consideration.

The resin substrate is, for example, a paper phenol substrate, paper epoxy substrate, glass epoxy substrate, composite base material epoxy substrate, glass composite substrate, glass polyimide substrate, bismaleimide-triazine (BT) substrate, fluorocarbon resin substrate, polyphenylene oxide (PPO) substrate, etc.

A ceramic substrate is favorable when heat dissipation, three-point bending strength, etc., are regarded as important.

It is favorable for the ceramic substrate to include one or two of silicon nitride, aluminum nitride, sialon, alumina (aluminum oxide), or zirconia (zirconium oxide) as a major component. Major component refers to a component included as not less than 50 mass %. In particular, it is more favorable for the ceramic substrate to be one of a silicon nitride substrate, an aluminum nitride substrate, or an Alusil substrate. Alusil is a material that includes a total of not less than 50 mass % of the two components of alumina and zirconia.

It is favorable for the thickness of the insulating substrate to be not less than 0.1 mm and not more than 1 mm. The strength may be insufficient when the substrate thickness is less than 0.1 mm. Also, when the substrate thickness is greater than 1 mm, the insulating substrate itself may become a thermal resistor and may degrade the heat dissipation of the insulating circuit board.

It is favorable for the three-point bending strength of the silicon nitride substrate to be not less than 600 MPa. It is favorable for the thermal conductivity to be not less than 80 W/m·K. The substrate thickness can be reduced by increasing the strength of the silicon nitride substrate. It is therefore favorable for the three-point bending strength of the silicon nitride substrate to be not less than 600 MPa, and more favorably not less than 700 MPa. The substrate thickness of the silicon nitride substrate can be thin, i.e., not more than 0.40 mm, or even not more than 0.30 mm.

The three-point bending strength of an aluminum nitride substrate is about 300 to 450 MPa. On the other hand, the thermal conductivity of an aluminum nitride substrate is not less than 160 W/m·K. Because the strength of the aluminum nitride substrate is low, it is favorable for the substrate thickness to be not less than 0.60 mm.

Although the three-point bending strength of an aluminum oxide substrate is about 300 to 450 MPa, an aluminum oxide substrate is inexpensive. Although the three-point bending strength of an Alusil substrate is high, i.e., about 550 MPa, the thermal conductivity is about 30 to 50 W/mK. An Alusil substrate is a substrate made of a sintered body in which aluminum oxide and zirconium oxide are mixed.

It is favorable for the conductor part to be a copper member or an aluminum member. The copper member is a copper plate, a copper alloy plate, a member made by providing a circuit configuration in a copper plate, or a member made by providing a circuit configuration in a copper alloy plate, and is made of copper or a copper alloy. The aluminum member is an aluminum plate, an aluminum alloy plate, a member made by providing a circuit configuration in an aluminum plate, or a member made by providing a circuit configuration in an aluminum alloy plate, and is made of aluminum or an aluminum alloy. Hereinafter, a member made by providing a circuit configuration in a copper plate is called a copper circuit. A member made by providing a circuit configuration in an aluminum plate is called an aluminum circuit. The conductor part may be a metalized layer or an electrically-conductive thin film other than a copper member or an aluminum member. The metalized layer is formed by firing a metal paste.

A ceramic substrate is favorable as the insulating substrate 2. It is favorable for the ceramic substrate to be one of a silicon nitride substrate or an aluminum nitride substrate. Silicon nitride substrates and aluminum nitride substrates are nitride ceramic substrates. A nitride ceramic forms titanium nitride by reacting with an active metal brazing material including Ti. Alumina substrates, zirconium substrates, and Alusil substrates are oxide ceramics. An oxide ceramic forms titanium oxide by reacting with an active metal brazing material including Ti. The bonding strength between the conductor part and the nitride ceramic or the oxide ceramic can be increased by using active metal bonding. A layer in which titanium nitride or titanium oxide is formed by a reaction between a ceramic and Ti is called a titanium reaction layer.

It is favorable for the conductor part to be a copper member or an aluminum member. An aluminum member is inexpensive compared with a copper member. Therefore, the conductor part may include an aluminum member.

On the other hand, compared with an aluminum member, a copper member is favorable because the thermal conductivity is excellent. A copper plate or copper circuit made of oxygen-free copper is an example of the copper plate or the copper circuit. Generally, the thermal conductivity of copper is high, i.e., about 400 W/m·K. To improve the heat dissipation, it is more favorable for the copper member to be a copper plate or copper circuit made of oxygen-free copper.

Here, the thicknesses of the conductor parts 3 and 4 may be not less than 0.3 mm, or even not less than 0.6 mm. The heat dissipation of the bonded body can be improved by making the conductor part thick. The thickness of the front conductor part 3 may be the same as or different from the thickness of the back conductor part 4. A copper member is especially favorable as the conductor part. It is favorable for the copper member to be made of oxygen-free copper. Oxygen-free copper has a copper purity of not less than 99.96 mass % as indicated in JIS-H-3100.

In the insulating circuit board according to the embodiment, in XPS analysis of the carbon amount at the conductor part surface, the average value of any three locations is within the range of not less than 0 at % and not more than 70 at %.

The insulating circuit board according to the embodiment may include only one conductor part or may include multiple conductor parts. That is, the number of conductor parts provided is not particularly limited. In measurement of the insulating circuit board includes multiple conductor parts, it is sufficient for the average value of the carbon amounts of any three locations at the surface of one of the conductor parts to be within the range of not less than 0 at % and not more than 70 at %. More favorably, the average value of the carbon amounts of any three locations at each of the surfaces of the conductor parts is within the range of not less than 0 at % and not more than 70 at %.

The conductor part surface refers to the conductor part surface of at least one of the front conductor part 3 or the back conductor part 4. XPS analysis of the carbon amount at the conductor part surface is performed. XPS analysis is X-ray photoelectron spectroscopy (X-ray Photoelectron Spectroscopy: XPS). XPS analysis is a method in which X-rays are irradiated on a sample surface, and the kinetic energy of the photoelectrons released from the sample surface are measured. Because the penetration depth of the X-rays is several μm, XPS analysis is used for qualitative analysis and quantitative analysis of the sample surface.

The SSI Corporation X-probe or an equivalent or better device is used as the XPS analysis device. In the analysis, Al $K_\alpha$-rays (hν=1486.6 eV) are used, and the spot diameter of the X-rays is set to a diameter of 1 mm. In the XPS analysis, other than carbon and oxygen, the amount of nitrogen and the amounts of the metallic elements included in the conductor part also are measured.

When a copper member is used as the conductor part, nitrogen, oxygen, copper, and carbon are extracted from the measured components. The carbon amount is measured using the total of these components as 100 at %. When the copper member includes a copper alloy, nitrogen, oxygen, copper, the other metals of the alloy, and carbon are extracted from the measured components; and the total of these components is used as 100 at %.

When an aluminum member is used as the conductor part, nitrogen, oxygen, aluminum, and carbon are extracted from the measured components. The carbon amount is measured using the total of these components as 100 at %. When the aluminum member includes an aluminum alloy, nitrogen, oxygen, aluminum, the other metals of the alloy, and carbon are extracted from the measured components; and the total of these components is used as 100 at %.

According to the following embodiments, an example is described in which the conductor part includes a copper member, and the insulating substrate includes a ceramic substrate. The following description also is applicable to cases where the conductor part includes members other than a copper member. When an aluminum member is used as the conductor part, "copper member" can be replaced with "aluminum member" as appropriate in the following description. Similarly, when the insulating substrate includes a resin substrate other than a ceramic substrate, "ceramic substrate" can be replaced with resin substrate as appropriate in the following description.

According to the embodiment, the carbon amount at the surface of the copper member is measured by XPS analysis. The average value of any three locations of the surface is used as the carbon amount. The "surface" that is analyzed does not include the side surface of the copper member. Any three locations means three locations selected from the surface of one copper member. When measuring, three locations of which the most distal portions of the spot diameters are away from each other by not less than 500 μm are selected. Also, it is favorable for the measurement locations to be locations where the semiconductor element is mounted.

The adhesion between the copper member and the plating film can be improved by setting the carbon amount at the copper member surface to be not less than 0 at % and not more than 70 at %. The plating film includes Ni (nickel), Au (gold), Ag (silver), an alloy including these elements as major components, etc. Nickel-phosphorus (NiP) or the like can be used as the alloy. Conventionally, a phenomenon occurs in which the carbon present at the copper member surface precipitates to the plating film surface. The carbon of the plating film surface had been a cause of voids occurring in the bonding layer used to bond with the semiconductor element. Therefore, this had become a factor that obstructs the adhesion between the plating film and the semiconductor element. A solder layer, a layer (a Ag nanoparticle layer) including silver as a major component, or the like is used as the bonding layer.

It is favorable for the carbon amount at the copper member surface to be not less than 0 at % and not more than 70 at %. More favorably, the carbon amount at the copper member surface is not less than 0 at % and not more than 60 at %. It is more favorable for the carbon amount at the copper member surface to be not less than 5 at % and not more than 60 at %. The lower the carbon amount, the better. On the other hand, the burden on the manufacturing processes is large when reducing the carbon amount at the copper member surface to be less than 5 at % (including 0 at % (below the detection limit)).

For example, in Patent Literature 1, the copper plate side surface of the ceramic circuit board is provided with an inclined shape. Also, the shape of the bonding layer jutting portion is adjusted. An etching process and a chemical polishing process are used to prepare these shapes. WO 2019/054294 (Patent Literature 3) discusses a method for manufacturing a ceramic circuit board that uses an etching process and a chemical polishing process. To control the shape, it is effective to perform an etching process or a chemical polishing process. Various chemical liquids are used in the etching process and the chemical polishing process. Also, to perform the etching process or the chemical polishing process, it is necessary to coat a resist onto the locations that should remain. Generally, a resist includes a resin. Many resins include carbon among the constituent elements. Conventionally, carbon remains at the copper member surface when the resist is insufficiently removed. Also, hydrocarbons such as methane, etc., are present in trace amounts in the air. The hydrocarbons easily adsorb to the copper member. This also is a cause of the presence of carbon at the copper member surface. It is therefore necessary to set the carbon amount at the copper member surface to be not more than 70 at %. In particular, it is more favorable for the carbon amount to be within the range of not less than 0 at % and not more than 70 at % no matter where the carbon amount is measured on the conductor part surface. When the average value of any three locations is calculated as described above, there are also cases where a location exists at which the carbon amount at a portion of the surface is greater than 70 at %. The characteristics can be further improved by the carbon amount being within the range of not less than 0 at % and not more than 70 at % no matter where the carbon amount is measured on the conductor part surface.

In XPS analysis of the oxygen amount of the copper member surface, it is favorable for the average value of three locations to be within the range of not less than 3 at % and not more than 50 at %. The method of the XPS analysis is the same as the analysis method of the carbon amount. The three locations where the oxygen amounts are measured are the same as the three locations where the carbon amounts are measured. That is, both the carbon amount and the oxygen amount are measured by one XPS analysis. In other words, the amounts of carbon and oxygen present in the same measurement area are simultaneously measured.

It is more favorable for the oxygen amount of the copper member surface to be within the range of not less than 3 at % and not more than 30 at %. Also, it is favorable for the ratio ($A_C/A_{ox}$) of the carbon amount ($A_C$) to the oxygen amount ($A_{ox}$) at the copper member surface to be not less than 0 and not more than 20. The carbon amount and the oxygen amount used to calculate the ratio are the average values of three locations described above. The ratio ($A_C/A_{ox}$) is 0 when the carbon amount is 0 at %.

Discrepancies due to carbon can be suppressed by the presence of oxygen at the copper member surface. The carbon precipitates to the plating film surface and causes discrepancies. The precipitation of carbon to the plating film surface can be suppressed by the presence of oxygen. When the oxygen amount at the copper member surface is less than 3 at %, the effect due to the presence of oxygen may be insufficient. Also, when the oxygen amount at the copper member surface is high, i.e., greater than 50 at %, the oxygen itself reacts with the copper member; and copper oxide is formed at the copper member surface. Therefore, the thermal conductivity of the copper member may decrease. Accordingly, it is favorable for the oxygen amount at the copper member surface to be within the range of not less than 3 at % and not more than 50 at %. Furthermore, when the oxygen amount at the copper member surface is within the range of not less than 3 at % and not more than 30 at %, the obstruction by the oxygen itself of the bonding between the copper member and the plating film or the bonding between the plating film and the solder layer can be suppressed. When the oxygen amount is high, i.e., greater than 30 at %, the oxygen itself may obstruct the adhesion between the plating film and the solder layer. Similarly, the effects due to carbon can be reduced by setting the ratio ($A_C/A_{ox}$) at the copper member surface to be not less than 0 and not more than 20. It is more favorable for the ratio ($A_C/A_{ox}$) at the copper member surface to be not less than 0.3 and not more than 16. As described above, the burden on the manufacturing processes is large when reducing the carbon amount at the copper member surface to be less than 5 at % (including below the detection limit). Therefore, the carbon amount may be not less than 5 atomic % when controlling the ratio of the oxygen amount and the carbon amount. When the carbon amount is not less than 5 at % and not more than 60 at %, it is more favorable for the ratio ($A_C/A_{ox}$) to be within the range of not less than 0.3 and not more than 16.

It is favorable for the chlorine ion amount present at the surface of the insulating circuit board to be not less than 0 μg and not more than 15 μg per 40 $cm^2$ of the surface area of the insulating circuit board. It is more favorable for the chlorine ion amount to be not less than 0 μg and not more than 3 μg per 40 $cm^2$ of the surface area of the insulating circuit board.

It is favorable for the sulfate ion ($SO_4$) amount present at the surface of the insulating circuit board to be not less than 0 μg and not more than 5 μg per 40 $cm^2$ of the surface area of the insulating circuit board. Also, it is more favorable for the sulfate ion ($SO_4$) amount to be not less than 0 μg and not more than 0.5 μg per 40 $cm^2$ of the surface area of the insulating circuit board.

It is favorable for the fluorine ion amount present at the surface of the insulating circuit board to be not less than 0 μg and not more than 2 μg per 40 $cm^2$ of the surface area of the insulating circuit board. Also, it is more favorable for the fluorine ion amount to be not less than 0 μg and not more than 1 μg per 40 $cm^2$ of the surface area of the insulating circuit board.

It is favorable for the ammonium ($NH_4$) ions present at the surface of the insulating circuit board to be not less than 0 μg and not more than 3 μg per 40 $cm^2$ of the surface area of the insulating circuit board. Also, it is more favorable for the ammonium ion ($NH_4$) amount to be not less than 0 μg and not more than 1 μg per 40 $cm^2$ of the surface area of the insulating circuit board.

There is a tendency for the multiple ions described above to adhere more easily to the copper member surface than to the surface of the insulating substrate. When present at the insulating substrate surface, the multiple ions described above may volatilize when bonding and induce contamination of the copper member surface. When the copper member is contaminated, bonding defects may be induced between the copper member and the semiconductor element. It is therefore favorable to control the above-mentioned ion amounts present at the entire insulating circuit board surface, including locations where the copper member is not bonded.

When the size of the surface area per insulating circuit board is less than 40 $cm^2$, it is favorable to use multiple insulating circuit boards to set the total value of the surface areas to be not less than 40 $cm^2$. This is because when the total value of the surface areas is less than 40 $cm^2$ and the surface area of the insulating circuit board is extremely small, the effects of outliers and noise may be excessive when converted using proportional relationships. Here, the measured surface area is the area of the flat surface and does not include the thickness component of the side surface. The flat surface refers to the surface substantially parallel to the bonding surface of the insulating substrate with the conductor part when the insulating circuit board is viewed from above. For example, when viewed from above, the surface (the upper surface) and the back side (the lower surface) of the insulating substrate can be considered to be flat surfaces when the conductor part is provided not to jut from the insulating substrate end portion. Because the front and back of the insulating circuit board are used as the calculation object of the surface area, surface area=insulating substrate longitudinal dimension×lateral dimension×2. Also, when the conductor part juts from the insulating substrate end portion when viewed from above, the flat surface of the jutting conductor part also is counted as the surface area. Thus, the thickness components of the insulating substrate and the conductor part are not included in the calculation of the surface area.

Here, when considering a straight line connecting points at end portions of the insulating substrate, the upward direction is defined as a direction perpendicular to the straight line. The area of the flat surface is defined as the sum of the area when viewed from the upward direction and the area when viewed from the downward direction. Accordingly, the value of 2 times the area when viewed from the upward direction is used as the surface area of the insulating circuit board.

Also, when there is only a small amount of the insulating circuit board and the total value of the surface areas is less than 40 $cm^2$, the size of the surface area may be converted by dividing the obtained impurity amount by the surface area ($cm^2$) and then multiplying by 40. Impurities refer to the chlorine ions, sulfate ions, fluorine ions, and ammonium ions described above. There is a proportional relationship of the surface area of the insulating circuit board and the impurity amount, so when the surface area per insulating circuit board is not 40 $cm^2$, it is sufficient to use the following formula to convert by using this relationship:

"impurity amount per 40 $cm^2$ of copper member"="impurity amount obtained by measurement"×40÷"total value of surface areas of insulating circuit board ($cm^2$)"

The amounts of the chlorine ions, sulfate ions, fluorine ions, and ammonium ions are measured by ion chromatography.

Chlorine ions easily adhere when an etching process of the copper member is performed using a chemical liquid of iron chloride, copper chloride, etc. Also, adhesion easily occurs when hydrochloric acid is used when cleaning.

Sulfate ions easily adhere when an etching process or a chemical polishing process is performed on a layer including Ag or Cu as a major component by using a chemical liquid of sodium thiosulfate, sulfuric acid, ammonium peroxodisulfate, etc.

Fluorine ions easily adhere when an etching process of a Ti reaction layer is performed using a chemical liquid of ammonium fluoride, etc.

Ammonium ions easily adhere when an etching process of a Ti reaction layer, an etching process, chemical polishing process, or the like of a layer including Ag or Cu as a major component, etc., are performed using a chemical liquid of ammonium fluoride, ammonium peroxodisulfate, etc.

When ions such as chlorine ions, sulfate ions, fluorine ions, and ammonium ions remain at the surface of the insulating circuit board (particularly the copper member surface), the reliability of the bonding between the conductor part (particularly, the copper member) and the plating film and the reliability of the bonding between the plating film and the semiconductor element degrade.

Also, when these ions are present at locations other than the copper member, the ions may vaporize and degrade the reliability of the bonding between the conductor part (particularly, the copper member) and the plating film and the reliability of the bonding between the plating film and the semiconductor element. It is therefore favorable to control the ion amount over the entire surface of the insulating circuit board.

It is sufficient for the components described herein as ions to be detected as ions when measuring; and these components may be present as compounds at the surface of the insulating circuit board. The sulfate ions are divalent anions; and the chlorine ions and the fluorine ions are monovalent anions. The ammonium ions are monovalent cations.

The reliability of the bonding between the copper member and the plating film is maintained by controlling these ion amounts at the surface of the insulating circuit board before the plating processing. It is therefore favorable to measure the ion amounts before the plating processing. Also, it is favorable for the ion amounts to be within the ranges described above even at the surface after the plating processing.

By setting the ion amounts to be within the ranges described above even at the surface after the plating film formation, the reliability of the bonding between the plating film and the semiconductor element also can be ensured. This is because the ions described above also may adhere when using a chemical liquid using sulfuric acid, ammonia, etc., in the plating processing.

When copper members are bonded to two surfaces of the ceramic substrate, it is favorable for the carbon amounts at the copper member surfaces of the two surfaces to be within the range of not less than 0 at % and not more than 70 at %. As described above, the bondability of the plating film is improved by controlling the carbon amount. It is therefore important to control the carbon amount at the copper member surface on which a plating film is provided. When copper members are provided at the two surfaces of the ceramic substrate, a copper plate or copper circuit may be provided at the front side; and a copper plate may be provided as a heat dissipation plate at the backside. A semiconductor element is mounted to the copper plate or copper circuit of the front side. When mounting the semiconductor element, a bonding layer such as a solder layer, a layer including silver as a major component, or the like is provided with a plating film interposed. The heat dissipation plate is used as a surface mounted to a heat sink, etc. There are also cases where a plating film is not used to mount to a heat sink because grease or the like is used. However, by controlling the carbon amounts at the copper member surfaces of the two surfaces, either of the copper members at the front side and backside can be used as mounting surfaces of semiconductor elements. In other words, an easy-to-use insulating circuit board (e.g., ceramic copper circuit board) can be provided.

According to the embodiment, it is favorable for the ceramic substrate and the copper member to be bonded via a bonding layer that includes carbon. It is favorable for the ceramic substrate and the copper member to be bonded via a bonding layer that includes titanium. An active metal brazing material that includes Ti is used in active metal bonding. The active metal brazing material includes silver or copper as a major component, as well as including Ti. A bonding layer that includes carbon can be formed by the active metal brazing material including carbon. The fluidity of the brazing material can be improved by the active metal brazing material including carbon. The bonding strength can be increased thereby.

It is favorable for the active metal brazing material to include not less than 0 mass % and not more than 70 mass % of Ag (silver), not less than 15 mass % and not more than 85 mass % of Cu (copper), and not less than 1 mass % and not more than 15 mass % of Ti (titanium) or $TiH_2$ (titanium hydride). Also, in the active metal brazing material, Nb or Zr may be used instead of Ti, or Nb or Zr may be added to Ti. However, it is favorable for the active metal brazing material to include not less than 1 mass % and not more than 15 mass % of Ti (titanium) or $TiH_2$ (titanium hydride).

When both Ti and $TiH_2$ are used, the total of the two is set to be within the range of not less than 1 mass % and not more than 15 mass %. When both Ag and Cu are used, it is favorable for the content of Ag to be not less than 20 mass % and not more than 70 mass %, and for the content of Cu to be not less than 15 mass % and not more than 65 mass %.

The brazing material may include not less than 1 mass % and not more than 50 mass % of one or two of Sn (tin) or In (indium) as necessary. It is favorable for the content of Ti or $TiH_2$ to be not less than 1 mass % and not more than 15 mass %. Also, the brazing material may include not less than 0.1 mass % and not more than 2 mass % of C (carbon) as necessary.

The ratio of the active metal brazing material composition is calculated using the total of the mixed solid raw materials as 100 mass %. It is favorable for the solid raw materials to be powders. For example, when the active metal brazing material includes the three of Ag, Cu, and Ti, Ag+Cu+Ti=100 mass % is set. When the active metal brazing material includes the four of Ag, Cu, $TiH_2$, and In, Ag+Cu+$TiH_2$+In=100 mass % is set. When the active metal brazing material includes the five of Ag, Cu, Ti, Sn, and C, Ag+Cu+Ti+Sn+C=100 mass % is set.

For the powder raw materials having the compositions described above, it is favorable to mix solvents corresponding to the compositions. By mixing solvents, the brazing material can be in paste form.

Ag or Cu is a component used as the base material of the brazing material. Sn or In has the effect of lowering the melting point of the brazing material. C (carbon) has the effect of controlling the fluidity of the brazing material and controlling the composition of the bonding layer by reacting with other components. Therefore, Ag—Cu—Ti, Ag—Cu—Sn—Ti, Ag—Cu—Ti—C, Ag—Cu—Sn—Ti—C, Ag—Ti, Cu—Ti, Ag—Sn—Ti, Cu—Sn—Ti, Ag—Ti—C, Cu—Ti—C, Ag—Sn—Ti—C, and Cu—Sn—Ti—C are examples of the components of the brazing material. Also, In may be used instead of Sn. Both Sn and In may be used.

It is favorable for the side surface of the copper member described above to have an inclined shape. In other words, it is favorable for the side surface of the copper member to be inclined with respect to the in-plane direction and the thickness direction. The in-plane direction is a direction parallel to the bonding surface of the ceramic substrate with the copper member. The thickness direction is a direction connecting the ceramic substrate and the copper member and is perpendicular to the in-plane direction.

It is favorable for the thickness of the bonding layer 5 to be within the range of not less than 10 μm and not more than 60 μm. Also, in the insulating circuit board, it is favorable for the bonding layer to have a shape jutting from the side surface of the copper member. A portion of the jutting bonding layer is called the bonding layer jutting portion. It is favorable for the ratio (L/T) of a length L to a thickness T of the bonding layer jutting portion to be within the range of not less than 0.5 and not more than 3.0. The thickness of the bonding layer jutting portion is the thickness at the thickest location in the bonding layer jutting portion. The length of the bonding layer jutting portion is the length at the longest location jutting from the copper member side surface. The thickness and length of the bonding layer jutting portion are measured in any cross section of the ceramic copper circuit board. The TCT characteristics of the ceramic copper circuit board can be improved by providing the inclined shape in the copper member and by providing the bonding layer jutting portion.

It is favorable for the maximum height Rz of the copper member surface to be not more than 20 μm. Also, it is favorable for the arithmetic average roughness Ra of the copper member surface to be not more than 5 μm. It is more favorable for the arithmetic average roughness Ra to be not more than 2 μm. It is more favorable for the arithmetic average roughness Ra to be not more than 1 μm. By making the copper member surface flatter, the adhesion between the copper member and the plating film or the bonding between the plating film and the bonding layer can be secure. Also, the bonding layer that is used in the bonding of the plating film can include a solder paste or a silver paste. Ra and Rz are described in JIS B 0601:2013. JIS B 0601:2013 corresponds to ISO 4287:1997/Amendment 1:2009 (IDT).

It is favorable for the ceramic substrate to be a silicon nitride substrate having a thickness of not more than 0.4 mm, and for the thickness of the copper member to be not less than 0.6 mm. An effect of lowering the thermal resistance of the ceramic substrate is provided by using a thin silicon nitride substrate having a thickness of not more than 0.4 mm. Also, the heat dissipation is improved by using a thick copper plate having a thickness of not less than 0.6 mm. Furthermore, the effects are easily obtained by using a silicon nitride substrate having a three-point bending strength of not less than 600 MPa.

An insulating substrate such as a ceramic copper circuit board or the like as described above is favorable for a semiconductor device in which a semiconductor element is mounted to an electrically-conductive part via a plating film and a bonding layer.

FIG. 2 is a schematic view showing an example of a semiconductor device according to the embodiment. In FIG. 2, 1 is an insulating circuit board, 6 is a semiconductor element, 7 is a plating film, 8 is a solder layer, and 10 is a semiconductor device. An example is shown in FIG. 2 in which one semiconductor element 6 is mounted to one insulating circuit board. Two or more semiconductor elements 6 may be mounted to one insulating circuit board. The example shown in FIG. 3 differs from the example shown in FIG. 2 in that the plating film 7 also is provided at the back conductor part. According to the embodiment of the invention, a plating film also may be provided at the back conductor part as shown in FIG. 3. The configuration of the plating film provided at the back conductor part may be different from the configuration of the plating film provided at the front conductor part. These plating films may be provided over the entire surface including the side surface, or may be provided at only a portion of the surface.

The semiconductor device 10 may further include a leadframe, wire bonding, etc. A layer (a Ag nanoparticle layer) including silver as a major component may be used instead of the solder layer 8. The solder layer is a bonding layer that uses a solder paste. Lead-free solder is an example of the material of the solder layer. Also, the layer that includes silver as a major component is a bonding layer that uses a silver paste. Because nanoparticles of Ag are used, the silver paste is discriminated from the lead-free solder including Ag.

In the semiconductor device 10 according to the embodiment, the carbon amount at the surface of the conductor part 3 (e.g., the copper member) is controlled, so that the precipitation of carbon to the plating film 7 surface can be suppressed. When the solder layer 8 is provided on the plating film 7 surface, carbon at the plating film 7 surface makes it easier for voids to occur in the solder layer 8. When there are voids in the solder layer 8, the bondability with the semiconductor element 6 degrades. This is similar when the solder layer 8 is replaced with a Ag nanoparticle bonding layer.

In recent years, semiconductor elements have higher performance. Accordingly, the junction temperatures of semiconductor elements are not less than 150° C., or even not less than 170° C. The semiconductor device 10 can exhibit bonding reliability between the plating film 7 and the semiconductor element 6 even when a semiconductor element having a high junction temperature is mounted. In other words, the insulating circuit board (e.g., the ceramic copper circuit board) according to the embodiment is favorable for a configuration in which a plating film is provided at the surface of the electrically-conductive part.

A method for manufacturing a ceramic copper circuit board that is an example of the insulating circuit board according to the embodiment will now be described. The manufacturing method is not particularly limited as long as the ceramic copper circuit board according to the embodiment has the configuration described above. A method for obtaining the ceramic copper circuit board with a high yield will now be illustrated.

First, a bonded body of a ceramic substrate and a copper plate is made. The specific configurations of the ceramic substrate and the copper plate are as described above.

The bonded body is bonded using active metal bonding. Active metal bonding is a bonding method using an active metal brazing material that includes an active metal such as titanium, etc. The components of the active metal brazing material are as described above. The active metal brazing material paste is prepared and coated onto the surface of the ceramic substrate. It is favorable for the coating thickness of the active metal brazing material paste to be within the range of not less than 10 μm and not more than 60 μm. The copper plate is disposed on the active metal brazing material paste layer. The active metal brazing material paste may be coated onto the copper plate; and the ceramic substrate may be disposed on the copper plate.

The longitudinal and lateral sizes of the ceramic substrate may be equal to the longitudinal and lateral sizes of the copper plate or may be different from the longitudinal and lateral sizes of the copper plate. When the thickness of the copper plate is not less than 0.6 mm, it is favorable for the longitudinal and lateral sizes of the ceramic substrate and the longitudinal and lateral sizes of the copper plate to be the same. Also, it is favorable to provide copper plates at two surfaces of the ceramic substrate. Such a configuration makes it easier to reduce the warp of the bonded body. Any circuit configuration can be formed in the copper plate by the etching process described below. A copper member that is pre-patterned into a circuit configuration also can be bonded to the ceramic substrate. However, a specific-purpose die is necessary to prepare a copper member that is pre-patterned into a circuit configuration. The preparation of a die corresponding to the circuit configuration may cause a cost increase.

Then, a thermal bonding process is performed. It is favorable for the heating temperature to be not less than 600° C. and not more than 930° C. A vacuum, an inert atmosphere, etc., are examples of the heating atmosphere. A vacuum refers to a state in which the pressure is not more than $10^{-3}$ Pa. An inert atmosphere is a noble gas atmosphere or a nitrogen atmosphere. A noble gas atmosphere is, for example, an argon atmosphere, helium atmosphere, neon atmosphere, xenon atmosphere, etc. In particular, when considering cost, a nitrogen atmosphere or an argon atmosphere is favorable. A nitrogen atmosphere is more favorable. The bonded body of the ceramic substrate and the copper plate can be manufactured by performing the thermal bonding process. A warp correction process may be performed on the bonded body as necessary.

Then, a chemical polishing process and an etching process are performed on the bonded body. These processes are processes that provide the copper plate with a circuit configuration. These processes may provide the copper plate side surface with an inclined shape, and may form a bonding layer jutting portion in which the bonding layer juts from the copper plate side surface.

An active metal brazing material that includes Ag or Cu as a major component and includes Ti is used in the active metal bonding. In the bonded body that uses active metal bonding, a Ti reaction layer is formed inside the bonding layer. When a nitride ceramic substrate is used, the Ti reaction layer is a layer of titanium nitride (TiN). When an oxide ceramic substrate is used, the Ti reaction layer is a titanium oxide ($TiO_2$) layer. A Ti reaction layer and a layer including Ag or Cu as a major component are formed in the bonding layer of the bonded body manufactured by active metal bonding. Carbon is distributed in the layer including Ag or Cu as a major component.

The nitride ceramic substrate is a substrate made of sialon, silicon nitride, aluminum nitride, etc.

The oxide ceramic substrate is a substrate made of alumina, zirconia, Alusil, etc.

To provide a circuit configuration in the etching process, an etching process of the copper plate, an etching process of the layer including Ag or Cu as a major component, and an etching process of the Ti reaction layer are necessary. Considering the etching efficiency, different chemical liquids are necessary for the three types of etching processes. Also, it is necessary to coat a resist onto locations not to be etched. Each time the location to be etched is changed, a resist removal process and a resist coating process are necessary. It is necessary to perform etching processes having different chemical liquids multiple times. For example, in the etching process of the copper plate, a chemical liquid that includes iron chloride or copper chloride is used. In the etching process of the layer including Ag or Cu as a major component, a chemical liquid that includes aqueous hydrogen peroxide or ammonium peroxodisulfide is used. The etching process of the Ti reaction layer uses a chemical liquid including aqueous hydrogen peroxide or ammonium fluoride. In addition, various chemical liquids also are used.

It is effective to use a chemical polishing process to increase the efficiency of the etching process as necessary. There are cases where the layer including Ag or Cu as a major component is oxidized by the chemical liquid of the etching process. A chemical polishing process is effective to remove the oxide layer. A chemical liquid that includes one, two, or more selected from sulfuric acid, hydrochloric acid, and sodium thiosulfate is used in the chemical polishing process.

The copper plate at the front side is patterned by the chemical polishing process, the etching process, etc., described above. For example, a copper circuit is formed by providing the copper plate with a circuit configuration. Or, multiple copper plates are formed by subdividing one copper plate. A ceramic copper circuit board to which a copper member (a copper circuit or a copper plate) is bonded is obtained thereby.

Also, various chemical liquids are used in the chemical polishing process, etching process, anti-rust treatment process, etc., as described above. Multiple processes are necessary to adjust the inclined shape of the copper member side surface, the shape of the bonding layer jutting portion, etc. In each process, a resist is coated onto the regions not to be removed. Generally, a resist is made of a resin. The resin includes carbon. A chemical liquid also is used to remove the resist. The carbon amount at the copper member surface is increased when the removal of the resist is insufficient.

A cleaning process is effective to control the carbon amount at the copper member surface. It is favorable to perform water cleaning or alkaline cleaning in the cleaning process.

Also, when only water cleaning is performed, it is favorable to perform the water cleaning process described below, which is a process without immersion, at least once. More favorably, if the cleaning process when only water cleaning is used is the cleaning process described below, the cleaning process becomes more favorable as the cleaning process is repeated. Also, multiple cleaning methods may be combined in one cleaning process. It is favorable for these cleanings to clean not only the conductor part but also the entire ceramic copper circuit board.

In the water cleaning, it is favorable for the flow rate to be not less than 1.3 L (liter)/minute. When the flow rate is not less than 1.3 L/minute, the effect of rinsing the carbon adhered to the copper member surface is sufficiently obtained. When the flow rate is less than 1.3 L/minute, the rinsing effect may be insufficient. For example, according to a method in which the ceramic copper circuit board is immersed and left idle in a cleaning tank containing water, the effect of reducing the carbon amount is insufficiently obtained because the flow rate is insufficient. Although not particularly limited, it is favorable for the upper limit of the flow rate to be not more than 10 L/minute. When the flow rate is large, i.e., greater than 10 L/minute, the water pressure may be too high and the copper member surface may deform. It is therefore favorable for the flow rate of the water cleaning to be not less than 1.3 L/minute and not more than 10 L/minute. More favorably, the flow rate of the water cleaning is not less than 1.5 L/minute and not more than 6 L/minute.

Methods that include control by circulating the water contained in the cleaning tank, control by using a nozzle, etc., are examples of methods for adjusting the flow rate. A method in which the adjustment of the flow rate is controlled using a nozzle is favorable. The flow rate is easily controlled by using a nozzle. According to the method in which the water contained in the cleaning tank is circulated, the control of the flow rate may be difficult when the amount of the water is high. When a nozzle is used, the flow rate of the water sprayed from the nozzle is set to be not less than 1.3 L/minute. Also, an ultrasonic wave may be applied to the water; and carbonic acid and/or oxygen may be dissolved in the water.

It is favorable for the distance between the nozzle and the ceramic copper circuit board to be within the range of not less than 5 cm and not more than 40 cm. It is more favorable to be within the range of not less than 5 cm and not more than 20 cm. When within these ranges, the amount of the water striking the ceramic copper circuit board is more easily adjusted. The impact shape of the water sprayed from the nozzle can have various shapes such as point, circular, elliptic, flattened, quadrilateral, etc. Various configurations such as cone-shaped, fan-shaped, etc., are applicable as the type of the nozzle. When nozzles are utilized, multiple nozzles per ceramic copper circuit board may be used, and the front conductor part and the back conductor part may be simultaneously cleaned.

It is favorable for the water amount that impacts the ceramic copper circuit board to be within the range of not less than 0.01 L/minute/$cm^2$ and not more than 0.1 L/minute/$cm^2$ per nozzle. The water amount that impacts the ceramic copper circuit board is called the water impact amount. The water impact amount indicates the water amount impacting per 1 $cm^2$ when the ceramic copper circuit board is viewed from above. The adjustment of the water impact amount on the ceramic copper circuit board can be performed using the water amount from the nozzle, the nozzle type, the distance between nozzles, etc., described above. Also, air jets can be combined when spraying the water from the nozzle. Also, an ultrasonic wave may be provided in the cleaning process. It is also effective to perform the cleaning process while conveying the ceramic copper circuit board. At this time, the ceramic copper circuit board may be obliquely positioned to increase the cleaning efficiency (the recovery efficiency of the liquid) and the installation area efficiency. Oblique means that the orientation of at least one side of the substrate is not parallel to a horizontal plane perpendicular to the direction of gravity. It is more favorable for the angle between the horizontal plane and the at least one side to be not less than 10 degrees but less than 90 degrees. An efficient method is to set the flow rate from the nozzle to be not less than 1.3 L/minute, and to set the water impact amount on the ceramic copper circuit board to be within the range of not less than 0.01 L/minute/$cm^2$ and not more than 0.1 L/minute/$cm^2$ per nozzle while conveying the ceramic copper circuit board.

It is favorable for the water to satisfy the quality of JIS-K-0557 (1998). JIS-K-0557 indicates quality of A1 to A4. ISO 3696 is referenced by JIS-K-0557.

Alkaline cleaning refers to the process of cleaning with an alkaline aqueous solution having a pH of not less than 10. Aqueous solutions such as organic alkaline, metal hydroxide, a salt of a metal hydroxide and a weak acid, etc., are examples of alkaline aqueous solutions having a pH of not less than 10. In particular, carbonic acid, diphosphoric acid, phosphoric acid, metasilicic acid, etc., are examples of weak acids as components of the salt. Lithium, potassium, sodium, barium, calcium, etc., are examples of types of metals when metal hydroxides and their salts are used. When Kb (the base dissociation constant) is too small, the necessary solute amount increases, and so it is favorable for the type of metal of the metal hydroxide and its salt that is used to be selected from potassium, sodium, and lithium. In particular, when considering cost, sodium hydroxide, sodium metasilicate, sodium carbonate, sodium phosphate, and tetrasodium diphosphate are favorable, and an aqueous solution including one, two, or more selected from these sodium compounds is favorable. An aqueous solution that includes not less than 0.5 mass % and not more than 5 mass % of these components is more favorable. Alkaline cleaning is effective for cleaning by removing impurities of the copper member surface.

It is favorable for the purity of these alkaline aqueous solutions to be high. It is more favorable for the purity to be not less than 96 mass %. When the purity is less than 96 mass %, impurities therein may adhere to the ceramic copper circuit board. A higher purity indicates fewer impurities included in the aqueous solution. Accordingly, a higher purity is favorable due to less adhesion of impurities. It is therefore more favorable for the purity to be not less than 98 mass %.

Organic compounds are often used in resists. Organic compounds are soluble in organic solvents because organic compounds have lower polarities than water. Therefore, when the resist includes an organic compound, cleaning that uses alcohol cleaning or ketones may be performed. Isopropanol, methanol, butanol, hexanol, ethanol, etc., are examples of alcohols. Also, acetone, etc., are examples of ketones. Ethanol or isopropanol are favorable when the solubility and volatility of organic compounds also are considered. Isopropanol is CAS Registry Number 67-63-0, and its IUPAC name is 2-propanol. Isopropanol is also called IPA or isopropyl alcohol.

It is favorable for the purity of alcohols other than water and such solvent components to be not less than 99 mass %. Impurities included in the alcohols or ketones used in the cleaning may adhere to the ceramic copper circuit board when the purity other than water and solvent components is less than 99 mass %.

Also, a mixture of two or more types of alcohols may be used in the alcohol cleaning. Furthermore, water may be mixed in the alcohol cleaning. When alcohols are mixed with water, it is favorable for the quality of the water that is used to satisfy JIS-K-0557 (1998). Ketones such as acetone, etc., may be added to alcohols as a solvent. That is, it is favorable for the impurity amount of alcohols other than water or solvents to be not more than 1 mass %.

However, considering cost, alkaline cleaning or water cleaning is more favorable than alcohol cleaning as the cleaning method. Also, multiple cleaning methods may be combined such as performing water cleaning after alkaline cleaning, etc.

By performing a cleaning process such as those described above, the carbon amount at the copper member surface can be reduced to be not more than 70 at %. Also, it is favorable to perform the cleaning process after the process of removing the resist. When the process of removing the resist is performed multiple times, it is favorable to perform a cleaning process each time.

The cleaning methods described above may be performed as the cleaning after the final resist removal process; and the cleaning after the other resist removal processes may be normal water cleaning. In such a case, it is favorable to set the time of the cleaning process after the final resist removal process to be long.

The cleaning processes after the etching process and after the chemical polishing may be normal water cleaning or may be water cleaning with a controlled flow rate. A normal cleaning process is a method in which the bonded body is immersed in a water cleaning tank. Also, the individual cleaning processes may be either batch or continuous. The batch technique is a method in which the cleaning process is performed with multiple bonded bodies placed in a cleaning basket. The continuous technique is a method in which the cleaning process is performed while a belt conveyor conveys multiple bonded bodies. An ultrasonic wave may be applied when performing the cleaning. By applying an ultrasonic wave, an effect of increasing the cleaning efficiency can be expected.

Cleaning methods also include methods that use a chlorine-based cleaning agent. A chlorine-based cleaning agent may increase the chlorine amount at the copper plate surface. Therefore, chlorine-based cleaning agents are unfavorable compared to the cleaning methods described above. Also, cleaning processes that use water vapor or ozone water are unfavorable because the copper plate may be oxidized. Therefore, cleaning processes such as water cleaning, alkaline cleaning, or alcohol cleaning are favorable.

The ceramic copper circuit board according to the embodiment can be manufactured by the processes described above.

Drying processes will now be described. Processing with an easily-volatilized solution, centrifugal force processing, air blow processing, etc., are examples of drying processes. Multiple drying processes may be combined. The water that remains on the ceramic copper circuit board after cleaning may be rinsed away by using easily-volatilized solvents including alcohols such as methanol, ethanol, isopropanol, or the like, ketones such as acetone, etc. Also, mixtures of alcohols and ketones may be used. In such a case, considering safety such as flammability, etc., it is favorable to use isopropanol. Also, the remaining water droplets may be removed using a centrifugal force by rotating the ceramic copper circuit board after cleaning.

Also, the ceramic copper circuit board may be positioned obliquely. Oblique refers to the state in which the orientation of any one or more sides of the substrate is not parallel to the horizontal direction, where any orientation existing in a plane perpendicular to the direction of gravity is taken as the horizontal direction. In such a case, when the angle between the horizontal direction and the direction of gravity is taken to be 90 degrees, it is more favorable for the angle between the horizontal direction and the orientation of any one or more sides of the substrate to be not less than 10 degrees but less than 90 degrees. It is more favorable for the orientation of the substrate to be such that the diagonals of the substrate are oblique. Thus, by setting the orientation of the substrate to be oblique, the water droplets adhered to the substrate easily fall due to gravity. For example, making the diagonals of the substrate oblique is an example of a method for making oblique.

It is favorable to blow off the remaining water droplets on the ceramic copper circuit board thus dried somewhat by blowing dry air or nitrogen gas. A method in which air, dry air, or nitrogen gas is blown is also called an air knife. An air knife is one type of air blowing.

To more reliably dry the ceramic copper circuit board thus obtained, air may strike the ceramic copper circuit board with a temperature of not less than 10° C., a humidity of not more than 70%, and an air velocity of not less than 20 m/s and not more than 150 m/s. The drying process of thus striking the ceramic copper circuit board with air is called air blowing. Also, a favorable air temperature in the air blow process is not less than 10° C. and not more than 150° C., and more favorably not less than 15° C. but less than 100° C. When this temperature is exceeded, the conductor part surface may be oxidized by heat. Also, a favorable humidity in the air blow process is not less than 5% and not more than 70%. When the humidity is greater than 70%, the time of the drying process may lengthen. The cost may increase when making the humidity less than 5%. It is favorable for the air velocity to be not less than 20 m/s and not more than 150 m/s. It is more favorable for the air velocity to be not less than 20 m/s and not more than 100 m/s. Drying takes time when the air velocity is too low. Also, when the air velocity is too high, unfavorable effects on the conveyance of the copper plate may occur. When performing the drying processes, oxidization of the copper plate surface, i.e., the conductor part, by the heat of the warm air can be suppressed by combining other drying processes to reduce the drying time of applying warm air when using the warm air drying process. Therefore, multiple drying processes may be combined.

After providing the copper plate with the circuit configuration, plating processing is performed as necessary. The plating film includes Ni (nickel), Au (gold), Ag (silver), an alloy including these elements as major components, etc. The plating processing may be either electroplating or electroless plating. The ceramic copper circuit board according to the embodiment can be manufactured by the processes described above.

Subsequently, a semiconductor device is made by mounting a semiconductor element to the ceramic copper circuit board in which the plating film is performed. In other words, the ceramic copper circuit board in which the plating film is provided is one type of ceramic copper circuit board.

EXAMPLES

Examples 1 to 12 and Comparative Examples 1 to 2

Ceramic substrates (silicon nitride substrates and aluminum nitride substrates) were prepared as examples of insulating substrates. The size of the prepared silicon nitride substrate was 50 mm long×40 mm wide×0.32 mm thick. The thermal conductivity was 90 W/m·K, and the three-point bending strength was 650 MPa. Also, the size of the prepared aluminum nitride substrate was 50 mm long×40 mm wide×0.635 mm thick. The thermal conductivity was 170 W/m·K, and the three-point bending strength was 400 MPa.

Copper plates (oxygen-free copper plates) were prepared as examples of conductor parts. The size of the copper plate was 50 mm long×40 mm wide. Then, the ceramic substrate and the copper plate were bonded by active metal bonding using an active metal brazing material including silver, copper, carbon, and titanium. Copper plates were bonded to two surfaces of the ceramic substrate. Table 1 shows the thicknesses of the copper plates and the thicknesses of the bonding layers. Bonded bodies according to the examples 1 to 12 and the comparative examples 1 and 2 were manufactured by this process.

TABLE 1

| | Ceramic substrate | Copper plate thickness (mm) | Bonding layer thickness (μm) |
|---|---|---|---|
| Example 1 | Silicon nitride substrate | 0.8 | 50 |
| Example 2 | Silicon nitride substrate | 0.8 | 40 |
| Example 3 | Silicon nitride substrate | 0.6 | 30 |
| Example 4 | Silicon nitride substrate | 0.6 | 30 |
| Example 5 | Silicon nitride substrate | 0.6 | 20 |
| Example 6 | Silicon nitride substrate | 0.7 | 35 |
| Example 7 | Silicon nitride substrate | 0.7 | 30 |
| Example 8 | Silicon nitride substrate | 0.6 | 20 |
| Example 9 | Aluminum nitride substrate | 0.5 | 20 |
| Example 10 | Aluminum nitride substrate | 0.3 | 30 |
| Example 11 | Aluminum nitride substrate | 0.3 | 40 |
| Example 12 | Aluminum nitride substrate | 0.3 | 40 |
| Comparative Example 1 | Silicon nitride substrate | 0.8 | 50 |
| Comparative Example 2 | Silicon nitride substrate | 0.8 | 50 |

Then, ceramic copper circuit boards, i.e., examples of insulating circuit boards, were made by performing an etching process and a chemical polishing process on the bonded bodies. The ceramic copper circuit boards that were made on the front side included copper plates (copper circuits) provided with circuit configurations, and included copper plates as heat dissipation plates on the backside. The copper circuit of the front side and the copper plate of the backside each were examples of conductor parts. The side surfaces of the copper circuit and the copper plate were provided with inclined shapes. Also, bonding layer jutting portions in which the bonding layers jutted from the copper plate side surface were provided. The ratio of the length to the thickness of the bonding layer jutting portion was set to be within the range of not less than 0.5 and not more than 3.0.

The etching process and the chemical polishing process were performed in the order of copper plate etching process resist removal chemical polishing process (first chemical polishing process) etching process of bonding layer including Ag or Cu as major component resist removal chemical polishing process (second chemical polishing process) etching process of titanium reaction layer resist removal. The cleaning processes after the processes were performed using the conditions shown in Table 2. Also, in the cleaning processes, in the case of water cleaning, the water amount emitted from the nozzle was set to be within the range of not less than 1.5 L/minute and not more than 6 L/minute. The cleaning processes were performed while conveying the ceramic copper circuit boards. Accordingly, the water impact amounts on the ceramic copper circuit boards per nozzle were set to the water amounts shown in Table 2. Also, the cleaning processes in which the bonded bodies were immersed in a water cleaning tank are indicated by "immersion".

The water impact amount on the ceramic copper circuit board per nozzle was unified to 0.02 L/minute/cm$^2$ in the cleaning processes after the copper plate etching process, the first chemical polishing process, the etching process of the bonding layer including Ag or Cu as a major component, the second chemical polishing process, and the etching process of the titanium nitride layer.

The case where alkaline cleaning was used is indicated by "alkaline cleaning".

For the drying processes of the ceramic copper circuit boards, a drying process by air blowing was performed after a drying process by air knife for the examples 1 to 12 and the comparative example 1. The temperatures of the air knife and the air blowing were room temperature (25° C. vicinity). The other conditions of the drying process were a humidity of about 50% and an air velocity of about 20 to 60 m/s. For the comparative example 2, cleaning was performed at conditions similar to those of the comparative example 1, after which natural drying was performed.

TABLE 2

| | Flow rate of cleaning process after resist removal (L/min/cm$^2$) | | |
|---|---|---|---|
| | After copper plate etching process | After bonding layer etching process | After titanium reaction tank etching process |
| Example 1 | 0.04 | 0.04 | 0.05 |
| Example 2 | 0.01 | 0.02 | 0.05 |
| Example 3 | 0.02 | Immersion | 0.03 |
| Example 4 | 0.03 | Immersion | Alkaline cleaning |
| Example 5 | 0.06 | Immersion | 0.05 |
| Example 6 | 0.10 | 0.10 | Alkaline cleaning |
| Example 7 | 0.07 | 0.02 | 0.06 |
| Example 8 | Immersion | Immersion | 0.05 |
| Example 9 | 0.10 | 0.05 | Alkaline cleaning |
| Example 10 | 0.02 | 0.03 | 0.03 |
| Example 11 | 0.03 | 0.04 | 0.05 |
| Example 12 | 0.03 | 0.04 | Alkaline cleaning |
| Comparative Example 1 | Immersion | Immersion | Immersion |
| Comparative Example 2 | Immersion | Immersion | Immersion |

The carbon amount and oxygen amount at the copper member surface of the ceramic copper circuit board were measured for the examples and the comparative examples. XPS analysis was used to measure the carbon amount and oxygen amount. An SSI Corporation X-probe was used as the XPS analysis device. In the XPS analysis, Al $K_\alpha$-rays (hν=1486.6 eV) were used, and the spot diameter of the X-rays was set to a diameter of 1 mm. In the XPS analysis, the amounts of carbon, oxygen, copper, and nitrogen were analyzed. The amounts of the components were calculated using the total of carbon, oxygen, copper, and nitrogen as 100 at %. The measurement results of the carbon amount and oxygen amount are shown in Table 3.

TABLE 3

| | Copper member surface | | |
|---|---|---|---|
| | Carbon amount (at %) | Oxygen amount (at %) | Carbon amount/oxygen amount ratio |
| Example 1 | 13 | 17 | 0.7 |
| Example 2 | 53 | 21 | 2.4 |
| Example 3 | 56 | 18 | 3.1 |
| Example 4 | 60 | 25 | 2.6 |
| Example 5 | 47 | 8 | 5.9 |
| Example 6 | 2 | 10 | 0.2 |
| Example 7 | 15 | 4 | 3.8 |
| Example 8 | 69 | 18 | 3.8 |
| Example 9 | 6 | 31 | 0.2 |
| Example 10 | 58 | 5 | 11.6 |
| Example 11 | 34 | 18 | 1.9 |
| Example 12 | 63 | 19 | 3.3 |
| Comparative Example 1 | 82 | 28 | 2.9 |

TABLE 3-continued

| | Copper member surface | | |
|---|---|---|---|
| | Carbon amount (at %) | Oxygen amount (at %) | Carbon amount/oxygen amount ratio |
| Comparative Example 2 | 85 | 38 | 2.5 |

The chlorine ions, ammonium ions, sulfate ions, and fluorine ions present at the surfaces of the ceramic copper circuit boards according to the examples and the comparative examples were measured. Ion chromatography analysis was used to measure the amounts of the chlorine ions, ammonium ions, sulfate ions, and fluorine ions. A DX500 made by Nippon Dionex K. K. was used as the ion chromatography analysis device. Also, for ion extraction, two samples and 40 ml of ultrapure water were placed in a cleaned fluorocarbon resin container (Φ100 mm), the lid of the fluorocarbon resin container was closed, and the ion components were extracted by holding for 18 hours at 80° C. in a constant temperature chamber.

Then, cool down was performed for about 1 hour, washing was performed together, and sampling was performed in auto sampling tubes. The measurement methods respectively for anions and cations were as follows.

For the anions (the fluorine ions, chlorine ions, sulfate ions, etc.), the Dionex Anion Standard (product number: 056933) made by Thermo SCIENTIFIC was used with 10-fold dilution as the calibration curve standard sample. Also, for the columns, IonPac AS4A-SC was used as the separation column, and IonPac AG4A-SC was used as the guard column. 30 ml of potassium hydroxide (KOH) was used as the eluent.

For the cations (the ammonium ions, etc.), the Dionex Cation-II Standard (product number: 046070) made by Thermo SCIENTIFIC was used with 100-fold dilution as the calibration curve standard sample. Also, for the columns, IonPac CS12A was used as the separation column, and IonPac CG12A was used as the guard column. 20 ml of methanesulfonic acid was used as the eluent.

In the ion chromatography analysis, the measurement was performed using two ceramic copper circuit boards. Therefore, the obtained ion amount divided by 2 was used as the impurity amount of the ions per ceramic copper circuit board. The surface area per ceramic copper circuit board was 40 $cm^2$.

The measurement results of the ion amounts of the examples and the comparative examples are shown in Table 4.

Also, ion chromatography analysis was similarly performed after providing the plating films on the ceramic copper circuit boards, but the ion amounts of all of the chlorine ions, ammonium ions, sulfate ions, and fluorine ions were within favorable ranges for the ceramic copper circuit boards used as the examples.

TABLE 4

| | Copper plate surface | | | |
|---|---|---|---|---|
| | Chlorine ions (μg/substrate) | Ammonium ions (μg/substrate) | Sulfate ions (μg/substrate) | Fluorine ions (μg/substrate) |
| Example 1 | 4 | 0.9 | 0.6 | 0.1 |
| Example 2 | 7 | 1.4 | 1.4 | 0.4 |
| Example 3 | 10 | 2.0 | 2.3 | 0.6 |
| Example 4 | 8 | 0.3 | 1.7 | 0.7 |
| Example 5 | 12 | 2.2 | 2.5 | 1.2 |
| Example 6 | 0 | 0 | 0 | 0 |
| Example 7 | 2 | 0.3 | 0.3 | 0.1 |
| Example 3 | 20 | 3.1 | 4.0 | 1.4 |
| Example 9 | 5 | 0.6 | 0.4 | 0.2 |
| Example 10 | 15 | 2.6 | 3.9 | 1.6 |
| Example 11 | 16 | 3.0 | 4.9 | 2.0 |
| Example 12 | 10 | 0.8 | 3.6 | 1.7 |
| Comparative Example 1 | 20 | 4.5 | 8.0 | 3.6 |
| Comparative Example 2 | 21 | 4.6 | 8.0 | 3.6 |

It can be seen from Table 4 that the carbon amount and the oxygen amount were within the desirable ranges in the ceramic copper circuit boards according to the examples. The carbon amount and oxygen amount of the back copper plate surface also had equivalent values. Also, the surface roughness Ra of the copper member surface was not more than 1 μm for the obtained ceramic copper circuit boards. Then, the plating process was performed. A Ni plating film or a Ag plating film was used as the plating film. A plating film was provided on the copper member of the front side in an area of 20 mm long×20 mm wide. The adhesion of the plating film was evaluated. The adhesion evaluation was performed using a tape test. Tape was adhered to the plating film; and the ratio of the remaining plating film when the tape was peeled was measured. Plating film residual ratio (%)=(plating film area after test/plating film area before test)×100 was displayed. The results are shown in Table 5.

TABLE 5

| | Plating film | Plating film residual ratio (%) |
|---|---|---|
| Example 1 | Ni | 96 |
| | Ag | 98 |
| Example 2 | Ni | 98 |
| | Ag | 98 |
| Example 3 | Ni | 92 |
| | Ag | 90 |
| Example 4 | Ni | 96 |
| | Ag | 93 |
| Example 5 | Ni | 94 |
| | Ag | 95 |
| Example 6 | Ni | 100 |
| | Ag | 100 |
| Example 7 | Ni | 100 |
| | Ag | 100 |
| Example 8 | Ni | 82 |
| | Ag | 85 |
| Example 9 | Ni | 94 |
| | Ag | 95 |
| Example 10 | Ni | 96 |
| | Ag | 97 |
| Example 11 | Ni | 92 |
| | Ag | 93 |
| Example 12 | Ni | 98 |
| | Ag | 94 |

TABLE 5-continued

| | Plating film | Plating film residual ratio (%) |
|---|---|---|
| Comparative | Ni | 78 |
| Example 1 | Ag | 73 |
| Comparative | Ni | 74 |
| Example 2 | Ag | 71 |

It can be seen from Table 5 that the adhesion between the copper member and the plating film was good for the ceramic copper circuit boards according to the examples. The adhesion was good even for a plating film having a wide area of 20 mm long×20 mm wide.

Then, semiconductor elements were mounted to the ceramic copper circuit boards according to the examples and the comparative examples. The semiconductor elements were mounted on the Ni plating films via lead-free solder. Also, the semiconductor elements were mounted on the Ag plating films via Ag nanoparticle bonding layers. The semiconductor devices were manufactured thereby.

The reliability of the bonding of the semiconductor element was evaluated for the semiconductor devices.

TCT tests of the semiconductor devices were performed to check the bonding reliability. The TCT test was performed using −40° C.×30 minutes→room temperature×10 minutes→170° C.×30 minutes→room temperature×10 minutes as 1 cycle, and a test of 500 cycles was performed. The bonding strength of the semiconductor element before testing and the bonding strength of the semiconductor element after testing were measured. The bonding strength was measured using a peel test. The reduction rate of the bonding strength before testing was checked. The reduction rate was calculated as an integer by rounding, to the nearest whole number, the value of the first decimal place.

The semiconductor devices having reduction rates of the bonding strength after testing of not more than 10% were best (double circle). The semiconductor devices having reduction rates of not less than 11% and not more than 19% were good (white circle). The semiconductor devices having reduction rates of not less than 20% but less than 30% were defective 1 (×). The semiconductor devices having reduction rates of not less than 30% were defective 2 (××). Also, two semiconductor elements were bonded on the copper plate via the solder layer. A peel test was performed before testing for one, and a peel test was performed after testing for the other. The reduction rates were measured from these results. The results are shown in Table 6.

TABLE 6

| | Plating film | Bonding strength reduction rate |
|---|---|---|
| Example 1 | Ni | ◎ |
| | Ag | ◎ |
| Example 2 | Ni | ◎ |
| | Ag | ◎ |
| Example 3 | Ni | ○ |
| | Ag | ○ |
| Example 4 | Ni | ◎ |
| | Ag | ○ |
| Example 5 | Ni | ○ |
| | Ag | ◎ |

TABLE 6-continued

| | Plating film | Bonding strength reduction rate |
|---|---|---|
| Example 6 | Ni | ◎ |
| | Ag | ◎ |
| Example 7 | Ni | ◎ |
| | Ag | ◎ |
| Example 8 | Ni | ○ |
| | Ag | ○ |
| Example 9 | Ni | ○ |
| | Ag | ◎ |
| Example 10 | Ni | ○ |
| | Ag | ○ |
| Example 11 | Ni | ◎ |
| | Ag | ○ |
| Example 12 | Ni | ◎ |
| | Ag | ○ |
| Comparative | Ni | X |
| example 1 | Ag | X |
| Comparative | Ni | X |
| example 2 | Ag | X X |

It can be seen from the tables that the reliability of the plating film was increased for the ceramic copper circuit boards according to the examples. Also, effects were confirmed for both the Ni plating film and the Ag plating film. It was confirmed that effects were obtained even when the material of the plating film changed. In contrast, in the comparative examples 1 and 2, the reliability degraded because the carbon amount at the copper member surface was high. Also, compared to the comparative example 1, the reliability degraded further in the comparative example 2 because the oxygen amount was high.

While certain embodiments of the inventions have been illustrated, these embodiments have been presented by way of example only, and are not intended to limit the scope of the inventions. These novel embodiments may be embodied in a variety of other forms; and various omissions, substitutions, modifications, etc., can be made without departing from the spirit of the inventions. These embodiments and their modifications are within the scope and spirit of the inventions and are within the scope of the inventions described in the claims and their equivalents. Also, the embodiments described above can be implemented in combination with each other.

What is claimed is:

1. An insulating circuit board, comprising:

a ceramic substrate; and a copper member bonded to at least one surface of the ceramic substrate the copper member being made of copper or a copper alloy, wherein the copper member and the ceramic substrate are bonded via a bonding layer including titanium, when XPS analysis of a carbon amount at a surface of the copper member is performed, an average value of the carbon amounts at any three locations being within a range of not less than 0 at % and not more than 70 at %, and when XPS analysis of an oxygen amount at the surface of the copper member is performed, an average value of the oxygen amounts at the three locations is within a range of not less than 3 at % and not more than 50 at %.

2. The insulating circuit board according to claim 1, wherein the average value of the carbon amounts is within a range of not less than 0 at % and not more than 60 at %.

3. The insulating circuit board according to claim 1, wherein the average value of the oxygen amounts is within a range of not less than 3 at % and not more than 30 at %.

4. The insulating circuit board according to claim 1, wherein a ratio of the average value of the carbon amounts to the average value of the oxygen amounts is not less than 0 and not more than 20.

5. The insulating circuit board according to claim 1, wherein the ceramic substrate includes silicon nitride or aluminum nitride as a major component.

6. The insulating circuit board according to claim 1, wherein the bonding layer includes carbon.

7. The insulating circuit board according to claim 1, wherein in measurement of ammonium ions present at a surface of the insulating circuit board are measured by ion-chromatography, an amount of the ammonium ions is not less than 0 μg and not more than 3 μg per 40 $cm^2$.

8. The insulating circuit board according to claim 1, wherein in measurement of ammonium ions present at a surface of the insulating circuit board are measured by ion-chromatography, an amount of the ammonium ions is not less than 0 μg and not more than 1 μg per 40 $cm^2$.

9. The insulating circuit board according to claim 1, wherein in measurement of chlorine ions present at a surface of the insulating circuit board are measured by ion-chromatography, an amount of the chlorine ions is not less than 0 μg and not more than 15 μg per 40 $cm^2$.

10. The insulating circuit board according to claim 1, wherein in measurement of sulfate ions present at a surface of the insulating circuit board by ion-chromatography, an amount of the sulfate ions is not less than 0 μg and not more than 5 μg per 40 $cm^2$.

11. The insulating circuit board according to claim 1, wherein in measurement of fluorine ions present at a surface of the insulating circuit board by ion-chromatography, an amount of the fluorine ions is not less than 0 μg and not more than 2 μg per 40 $cm^2$.

12. The insulating circuit board according to claim 1, wherein a maximum height Rz of the surface of the copper member is not more than 20 μm.

13. The insulating circuit board according to claim 1, wherein a surface roughness Ra of the surface of the copper member is not more than 2 μm.

14. The insulating circuit board according to claim 1, wherein the ceramic substrate is a silicon nitride substrate having a thickness of not more than 0.4 mm, and a thickness of the copper member is not less than 0.6 mm.

15. The insulating circuit board according to claim 1, wherein the conductor part is a copper member, and a surface of the copper member includes a location where a plating film is provided.

16. The insulating circuit board according to claim 15, wherein in measurement of sulfate ions included in a surface of the insulating circuit board including the plating film by ion-chromatography, an amount of the sulfate ions is not less than 0 μg and not more than 5 μg per 40 $cm^2$.

17. The insulating circuit board according to claim 16, wherein in measurement of ammonium ions included in the surface of the insulating circuit board including the plating film by ion-chromatography, an amount of the ammonium ions is not less than 0 μg and not more than 3 μg per 40 $cm^2$.

18. A semiconductor device, comprising:

the insulating circuit board according to claim 1; and a semiconductor element mounted on the copper member via a solder layer or a layer including silver as a major component.

* * * * *